(12) United States Patent
Lua

(10) Patent No.: US 11,626,817 B2
(45) Date of Patent: Apr. 11, 2023

(54) VORTEX-INDUCED VIBRATION WIND ENERGY HARVESTING DEVICE

(71) Applicant: NATIONAL CHIAO TUNG UNIVERSITY, Hsinchu (TW)

(72) Inventor: Kim-Boon Lua, Singapore (SG)

(73) Assignee: National Chiao Tung University, Hsinchu (TW)

(*) Notice: Subject to any disclaimer, the term of this patent is extended or adjusted under 35 U.S.C. 154(b) by 327 days.

(21) Appl. No.: 17/018,318

(22) Filed: Sep. 11, 2020

(65) Prior Publication Data

US 2021/0328525 A1 Oct. 21, 2021

(30) Foreign Application Priority Data

Apr. 16, 2020 (TW) .................................. 109112794

(51) Int. Cl.
*H02N 2/18* (2006.01)
*H01L 27/20* (2006.01)
(Continued)

(52) U.S. Cl.
CPC ............. *H02N 2/188* (2013.01); *H01L 27/20* (2013.01); *H01L 41/0472* (2013.01);
(Continued)

(58) Field of Classification Search
CPC .................................. H02N 2/18; H01L 41/113
See application file for complete search history.

(56) References Cited

U.S. PATENT DOCUMENTS 7,208,845 B2 * 4/2007 Masters ............... H02K 7/1892
290/1 R
2006/0064972 A1 * 3/2006 Allen ........................ F03D 5/06
60/369
(Continued)

FOREIGN PATENT DOCUMENTS

CN 109245609 A * 1/2019
CN 110086376 A * 8/2019 ............. H02N 2/188
(Continued)

OTHER PUBLICATIONS

Search Report issued by International Office for corresponding Application No. 109112794.
(Continued)

*Primary Examiner* — J. San Martin
(74) *Attorney, Agent, or Firm* — Rosenberg, Klein & Lee (57) ABSTRACT

A vortex-induced vibration wind energy harvesting device, including an array consisting of a plurality of oscillators and a plurality of piezoelectric microelectromechanical systems (MEMSs), is provided. An oscillator is mounted on each of the piezoelectric MEMSs. When any one of the oscillators is oscillated by and resonant with vortex shedding due to an incoming airflow, its vortices in the wake will enhance the oscillation of the downstream oscillators, so that overall oscillation of the oscillators in the array is strengthened. The piezoelectric MEMSs are deformed by the vibration of these oscillators to generate voltage and current to output. In the present invention, the oscillators are arranged closely. When the airflow passes the array, even weak airflow can generate periodic force and cause significant oscillation due to resonance. The MEMS can convert mechanical energy into electrical energy and output it in order to achieve the purpose of wind energy harvesting.

7 Claims, 6 Drawing Sheets

(51) Int. Cl.
*H01L 41/113* (2006.01)
*H01L 41/27* (2013.01)
*H01L 41/047* (2006.01)
*H01L 41/083* (2006.01)
*H01L 41/187* (2006.01)

(52) U.S. Cl.
CPC ......... *H01L 41/083* (2013.01); *H01L 41/1136* (2013.01); *H01L 41/187* (2013.01); *H01L 41/27* (2013.01)

(56) References Cited

U.S. PATENT DOCUMENTS

| | | | |
|---|---|---|---|
| 2012/0119625 A1 | 5/2012 | Shih | |
| 2013/0119669 A1* | 5/2013 | Murphree | H02N 2/185 290/54 |
| 2013/0227940 A1* | 9/2013 | Greenblatt | F03B 17/06 60/459 |
| 2014/0175800 A1* | 6/2014 | Thorp | F03D 7/00 290/55 |
| 2014/0312742 A1* | 10/2014 | Balasingam | H02N 2/22 29/25.35 |
| 2017/0033713 A1* | 2/2017 | Petroni | H01L 41/047 |
| 2017/0284365 A1* | 10/2017 | Yañez Villarreal | H02K 35/02 |

FOREIGN PATENT DOCUMENTS

| | | | | |
|---|---|---|---|---|
| EP | 2602483 A1 | | 6/2013 | |
| GN | 110710097 A | | 1/2020 | |
| KR | 20200110487 A | * | 9/2020 | ............. H02N 2/186 |

OTHER PUBLICATIONS

S. Pobering and N. Schwesinger, "Power Supply for Wireless Sensor Systems," in Proceedings of the 7th IEEE Conference on Sensors, pp. 685-688, Lecce, Italy, Oct. 2008.

S. Pobering, M. Menacher, S. Ebermaier, and N. Schwesinger, "Piezoelectric Power Conversion With Self-Induced Oscillation," in Proceedings of the Powermems, pp. 384-387, 2009.

L. A. Weinstein, M. R. Cacan, P. M. So, and P. K. Wright, "Vortex Shedding Induced Energy Harvesting From Piezoelectric Materials in HVAC Flows," Smart Materials and Structures, vol. 21, No. 4, Article ID045003,2012.

X. Gao, W.-H. Shih, and W. Y. Shih, "Flow Energy Harvesting Using Piezoelectric Cantilevers With Cylindrical Extension," IEEE Transactions on Industrial Electronics, vol. 60, No. 3, pp. 1116-1118, 2013.

D.-A. Wang and H.-H. Ko, "Piezoelectric Energy Harvesting From Flow-Induced Vibration," Journal of Micromechanics and Microengineering, vol. 20, No. 2, Article ID025019, 2010.

A. Bansal, D. A. Howey, and A. S. Holmes, "CM-Scale Air Turbine and Generator for Energy Harvesting From Low-Speed Flows," in Proceedings of the 15th International Conference on Solid-State Sensors, Actuators and Microsystems (Transducers '09), pp. 529-532, Denver, CO, USA, Jun. 2009.

D. A. Howey, A. Bansal, and A. S. Holmes, "Design and Performance of a CM-Scale Shrouded Wind Turbine for Energy Harvesting," Smart Materials and Structures, vol. 20, No. 8, Article ID 085021, 2011.

Yin Jen Lee, Yi Qi, Guangya Zhou, Kim Boom Lua, "Vortex-Induced Vibration Wind Energy Harvesting by Piezoelectric MEMS Device in Formation," Scientific Reports 2019.

* cited by examiner

VORTEX-INDUCED VIBRATION WIND ENERGY HARVESTING DEVICE

This application claims priority for Taiwan patent application no. 109112794 filed on 16 Apr. 2020, the content of which is incorporated by reference in its entirely.

BACKGROUND OF THE INVENTION

Field of the Invention

The present invention relates to a wind energy harvesting device, particularly to a vortex-induced vibration wind energy harvesting device.

Description of the Related Art

Air is moving constantly. Along with the natural wind, airflow is generated by indoor air conditioners, electric fans, opening and closing doors, walking, or fans in computers. The energy in the airflow can be collected and converted into electrical energy, which is the main purpose of wind energy harvesting.

The conventional rotational wind turbines are the most commonly used devices to harvest wind energy. Despite the successful application at large scale, this kind of devices is facing problems when scaling down. These devices consist of complex mechanical components, such as gears, bearings, and blades. It is difficult to fabricate these components at micro-scale. Even if these miniaturized components are fabricated, assembly and maintenance are difficult at such a small scale. In addition, to move the blades, the rotational wind turbines require high wind speed to overcome friction and inertia. That is, the rotational wind turbines require a very strong wind to actuate. The breeze or low airflow are not able to actuate the rotational wind turbines. The friction increases significantly as the size reduced. Therefore, friction is very high at micro-scale, resulting in the efficiency of the rotational wind turbines in harvesting wind energy to be very low or even zero. Besides, the rotational wind turbines cannot be arranged in close formation to enhance power output.

To overcome the abovementioned problems of the prior art, the present invention provides a vortex-induced vibration wind energy harvesting device.

SUMMARY OF THE INVENTION

The primary objective of the present invention is to provide a vortex-induced vibration wind energy harvesting device, wherein air flows through the vortex-induced vibration wind energy harvesting device to generate periodic shedding vortices, induce periodic force and cause significant oscillations due to resonance. By arranging oscillators into an array of close formation, the interaction of the wake of each oscillator with oscillators at the downstream will enhance power output. Another objective of the present invention is to provide a vortex-induced vibration wind energy harvesting device, which combines the vortex-induced vibration (VIV) concept with the miniaturized microelectromechanical systems (MEMSs) for effective wind energy harvesting.

In an embodiment of the present invention, a vortex-induced vibration wind energy harvesting device is provided. The vortex-induced vibration wind energy harvesting device includes a plurality of oscillators arranged into an array. When one of the plurality of oscillators generate and resonate with the periodic shedding vortices due to an incoming airflow, the oscillation of at least one of the plurality of oscillators in the downstream wake is enhanced, thereby enhancing overall oscillation phenomena of the array; and a plurality of piezoelectric MEMSs, each connected to the plurality of oscillators respectively, generating and outputting voltage and current due to the oscillation of the plurality of oscillators.

In an embodiment of the present invention, the plurality of oscillators are made out of hollow cylinders.

In an embodiment of the present invention, each of the plurality of piezoelectric MEMSs comprises of: a MEMS chip; a piezoelectric cantilever arranged on the MEMS chip; a pad oxide layer arranged on the piezoelectric cantilever for insulation, wherein the pad oxide layer is designed with a first opening and a second opening, and one of the plurality of oscillators is mounted on a portion of the pad oxide layer; a piezoelectric layer arranged on the piezoelectric cantilever, wherein a portion of the piezoelectric layer is located in the first opening, when the oscillator oscillates, the piezoelectric layer is deformed by bending force, thereby generating voltage and current; and the two output terminals are used as a positive terminal and a negative terminal respectively, wherein one of the two output terminals is arranged on the piezoelectric cantilever and arranged in the second opening. The other output terminal is arranged in the first opening, covers and connects to the piezoelectric layer. The two output terminals are configured to output the voltage and current generated by the piezoelectric layer.

In an embodiment of the present invention, an oxide layer is arranged between the MEMS chip and the piezoelectric cantilever.

In an embodiment of the present invention, the cantilevered portion of the piezoelectric cantilever is suspended, the MEMS chip is not arranged under the cantilevered portion, and one of the plurality of oscillators and the piezoelectric layer are arranged on the cantilevered portion.

In an embodiment of the present invention, the piezoelectric layer is made of aluminum nitride.

In an embodiment of the present invention, the plurality of oscillators are spaced at uniform intervals.

Below, the embodiments are described in detail with the aids of drawings, to make the technical contents, characteristics and accomplishments of the present invention can be easily understood.

DETAILED DESCRIPTION OF THE INVENTION

The present invention provides a vortex-induced vibration wind energy harvesting device, which uses an array of oscillators resonating with periodic shedding vortices, and arranged in close formation to enhance the oscillation and uses piezoelectric microelectromechanical systems (MEMSs) to harvest wind energy, thereby increase the harvested wind energy.

Figure 1:
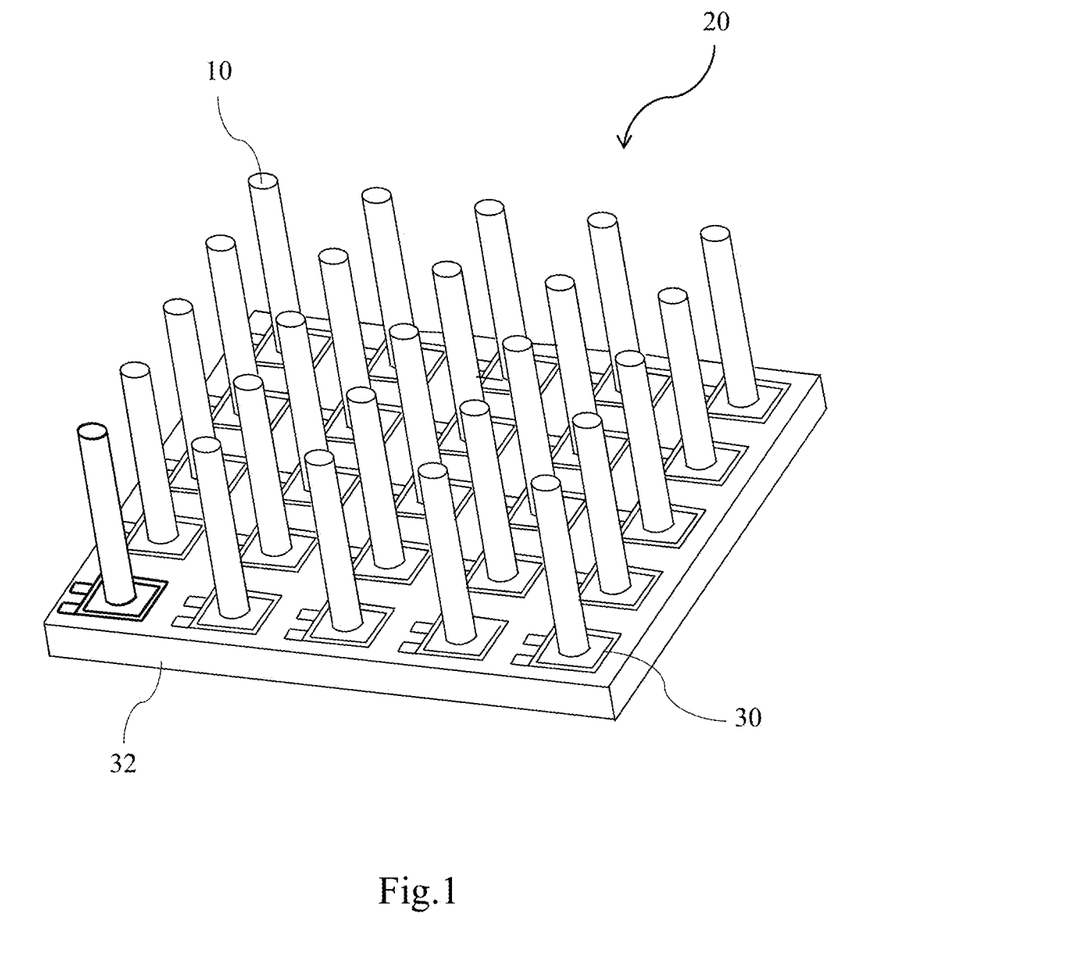
FIG. 1 is a schematic diagram illustrating a vortex-induced vibration wind energy harvesting device according to an embodiment of the present invention.

FIG. 1 is a schematic diagram illustrating a vortex-induced vibration wind energy harvesting device according to an embodiment of the present invention. In the vortex-induced vibration wind energy harvesting device, a plurality of oscillators 10 are arranged into an array 20. The plurality of oscillators 10 are substantially spaced at uniform intervals. Each of the plurality of oscillators 10 is mounted on a piezoelectric MEMS 30. The piezoelectric MEMSs 30 are manufactured on a MEMS chip 32. When the oscillator 10 oscillates, the piezoelectric MEMS 30 generates voltage and current due to the force transmitted from the oscillator 10.

When air flows through the oscillators, vortices are generated and shed periodically from the oscillators. It is worthy mentioned that when one of the plurality of oscillators 10 oscillates and resonates with the periodic shedding vortices, the oscillation of at least one of the plurality of oscillators in the downstream wake is enhanced, thereby enhancing overall oscillation phenomena of the array 20.

Figure 2:
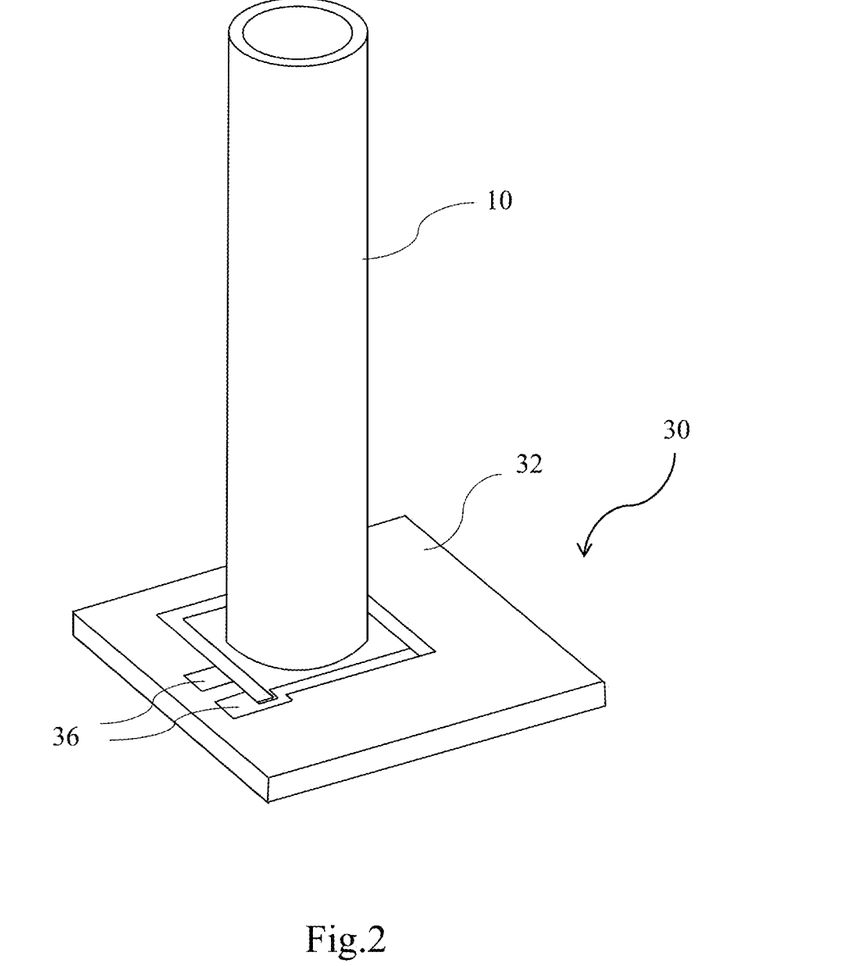
FIG. 2 is a schematic diagram illustrating a single oscillator and a piezoelectric microelectromechanical system (MEMS) of the vortex-induced vibration wind energy harvesting device of FIG. 1.
Figure 3:
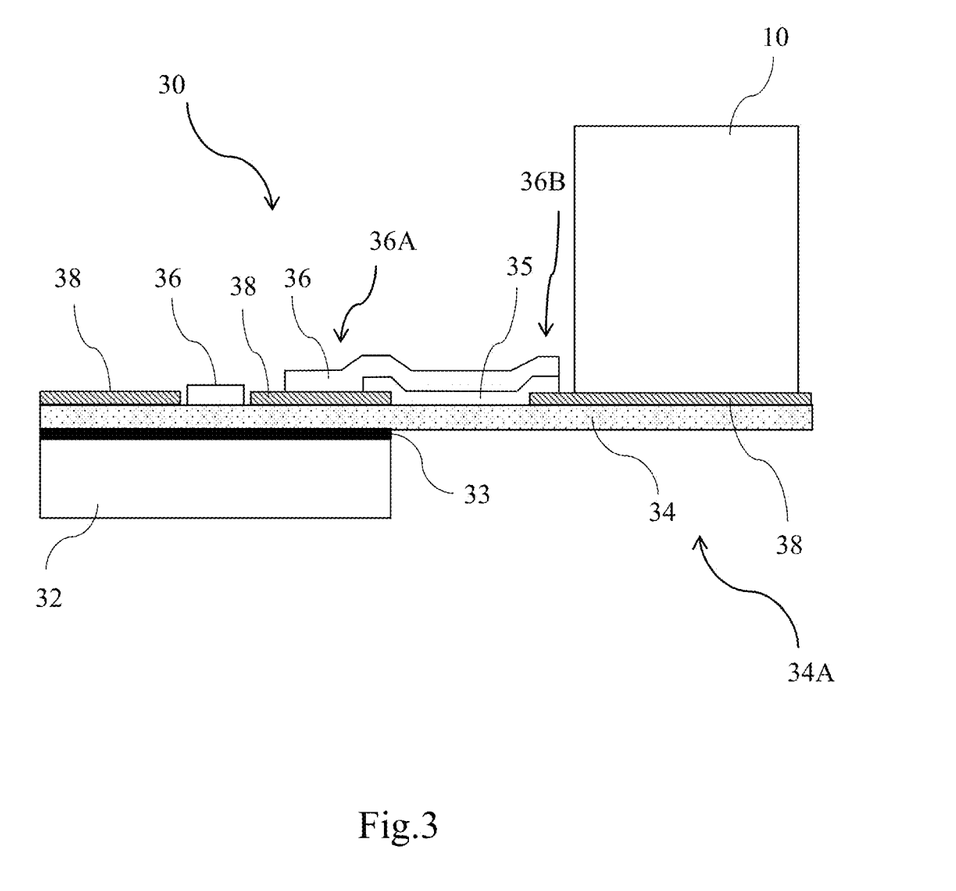
FIG. 3 is a cross-sectional view of FIG. 2.

FIG. 2 is a schematic diagram illustrating a single oscillator 10 and a piezoelectric MEMS 30 of the vortex-induced vibration wind energy harvesting device shown in FIG. 1. FIG. 3 is a cross-sectional view of FIG. 2. Referring to FIG. 2 and FIG. 3, the detailed structures of the oscillator 10 and the piezoelectric MEMS 30 are introduced as follows.

The flowing of the air can induce vibration. In addition to the wind in nature, the wind generated by air conditioners, electric fans, opening and closing doors, or walking can induce the oscillation of the oscillator 10. In the embodiment, the oscillator 10 is made out of a hollow cylinder. The length, outer diameter, inner diameter, thickness, and material of the cylinder can influence the vibration frequency and resonance effect. The distance between the neighboring oscillators 10 also influences the strength of the resonance phenomenon. The present invention should not be limited by these factors. The energy harvesting device that combines the array formed of hollow cylindrical oscillators with the piezoelectric MEMS to generate voltage is also included within the scope of the present invention.

As illustrated in FIG. 2, the piezoelectric MEMS 30 includes a MEMS chip 32, a piezoelectric cantilever 34, and two output terminals 36. The two output terminals 36 are used as the positive terminal and the negative terminal respectively. The figure does not limit which one of the two output terminals 36 is used as the positive terminal or the negative terminal. In further detail, referring to FIG. 3, the piezoelectric MEMS 30 includes an oxide layer 33, a piezoelectric layer 35, and a pad oxide layer 38. The piezoelectric cantilever 34 is arranged on the MEMS chip 32. The oxide layer 33 is arranged between the MEMS chip 32 and the piezoelectric cantilever 34. The pad oxide layer 38 is arranged on the piezoelectric cantilever 34 for insulation. The pad oxide layer 38 is designed with a first opening and a second opening. The piezoelectric layer 35 is arranged on the piezoelectric cantilever 34. A portion of the piezoelectric layer 35 is located in the first opening of the pad oxide layer 38. The oscillator 10 is mounted on the pad oxide layer 38.

In addition, one of the two output terminals 36 (e.g., on the left side of FIG. 3) is arranged on the piezoelectric cantilever 34 and arranged in the second opening of the pad oxide layer 38. The other output terminal 36 (e.g., on the right side of FIG. 3) has two ends 36A and 36B. The end 36A of the output terminal 36 is arranged on the pad oxide layer 38. The end 36B of the output terminal 36 extends to cover the piezoelectric layer 35 and connect to the piezoelectric layer 35. In the embodiment, the end 36B, the piezoelectric layer 35, and the oscillator 10 are located above the cantilevered portion 34A of the piezoelectric cantilever 34. In other words, the MEMS chip 32 is not arranged under the piezoelectric layer 35 and the oscillator 10.

The oscillator 10 is mounted on the cantilevered portion 34A of the piezoelectric cantilever 34. Thus, the operation of the embodiment is described as follows. When the oscillator 10 oscillates due to an incoming airflow, the piezoelectric cantilever 34 deforms the piezoelectric layer 35 due to the force transmitted from the oscillator 10, thereby generating voltage and current. The two output terminals 36 are configured to output the voltage and current generated by the piezoelectric layer 35 to an external device (not illustrated).

Figure 4:
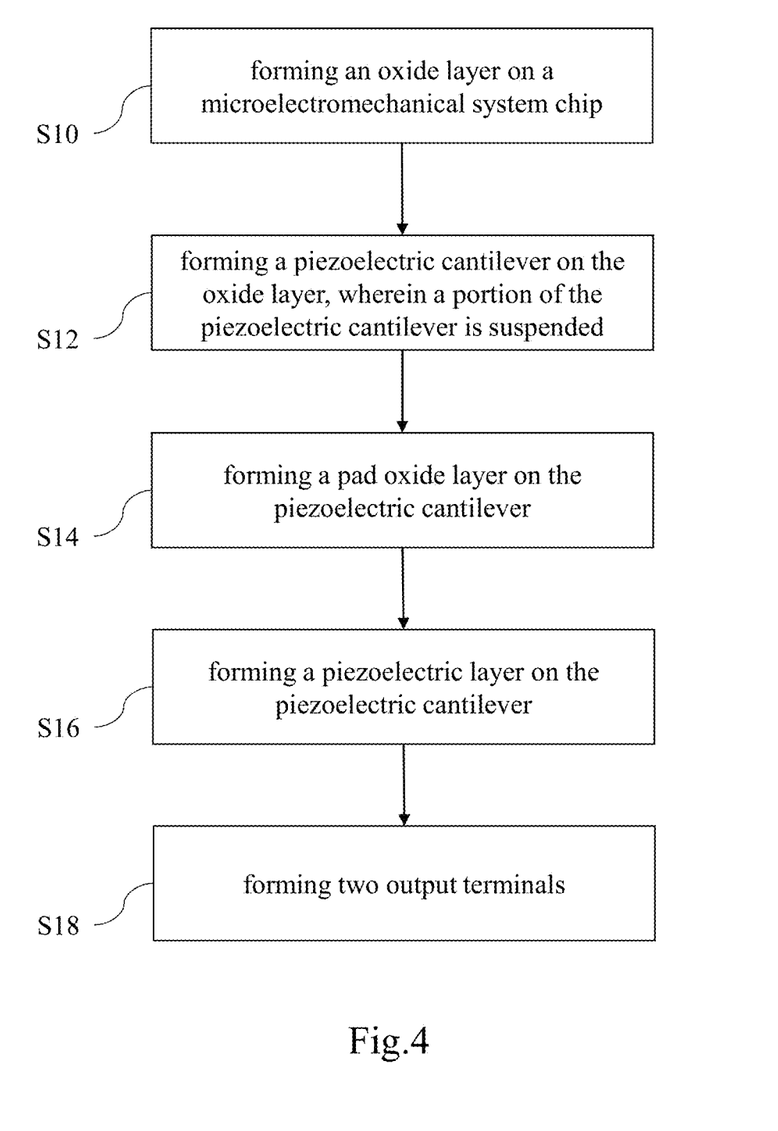
FIG. 4 is a manufacturing flowchart of the piezoelectric MEMS of FIG. 2.

Furthermore, the piezoelectric MEMS 30 can be fabricated by the semiconductor manufacturing technology. Thus, the piezoelectric MEMS 30 has a semiconductor structure. The piezoelectric MEMS 30 is fabricated by the MEMSCAP's PiezoMUMPs 5-mask level patterning and etching process. FIG. 4 is a manufacturing flowchart of the piezoelectric MEMS of FIG. 3. Referring to FIG. 3 and FIG. 4, the structure and the manufacturing process of the piezoelectric MEMS are introduced as follows. In Steps S10~S12, the oxide layer 33 is formed on the MEMS chip 32 (Step S10). Then, the piezoelectric cantilever 34 is formed on the oxide layer 33 (Step S12), wherein a portion of the piezoelectric cantilever 34 is suspended, namely the cantilevered portion 34A in FIG. 3. The MEMS chip 32 is not arranged under the cantilevered portion 34A. The piezoelectric layer 35 is made of aluminum nitride.

Then, in Step S14, the pad oxide layer 38 is formed on the piezoelectric cantilever 34. Pattern is created on pad oxide layer 38 using masks, etching processes, or other semiconductor manufacturing processes. As a result, multiple opening is formed on the pad oxide layer 38, such as a first opening and a second opening. The pad oxide layer 38 above the cantilevered portion 34A of the piezoelectric cantilever 34 is where the oscillator 10 mounted on. In Step S16, the piezoelectric layer 35 is formed on the piezoelectric cantilever 34. The piezoelectric layer 35 is located in the first opening of the pad oxide layer 38. The piezoelectric layer 35 is arranged on the cantilevered portion 34A of the piezoelectric cantilever 34. Finally, in Step S18, the two output terminals 36 are formed and used as a positive terminal and a negative terminal respectively. One of the two output terminals 36 is arranged on the piezoelectric cantilever 34, in the second opening of the pad oxide layer 38, and arranged above the MEMS chip 32. The other output terminal 36 covers the piezoelectric layer 35. As shown in the figure, the output terminal 36 on the piezoelectric layer 35 extends to the pad oxide layer 38.

The piezoelectric MEMS 30 of the embodiment is a micro device with electrical and mechanical functions, wherein the micro device is fabricated using the semiconductor manufacturing technology. Accordingly, the piezoelectric MEMS 30 has the movement ability of mechanical structures. The present invention uses the movement ability of mechanical structures to generate electrical power.

It is worth mentioning that hundreds or thousands of piezoelectric MEMSs 30 can be made on one silicon wafer at the same time. Furthermore, multiple piezoelectric MEMSs 30 can be made on a single MEMS chip 32 to form array directly Owning to these advantages, a micro wind energy harvesting device 32 can be mass manufactured. Therefore, the micro wind energy harvesting device 32 has the advantages of small size, high manufacturing precision, and low cost.

The resonance phenomena of the oscillator array of the present invention is explained as follows. The present invention generates wind force based on the vortex-induced vibration (VIV) concept and enhance the wind force with formation effects, and integrates with the miniaturized MEMS for effective wind energy harvesting. VIV is a fluid-structure interaction in which vortices shed periodically from a cylindrical oscillator exposed to an incoming flow, induce oscillating force and cause significant oscillations due to resonance. By arranging the oscillators in close formation, the airflow flows through the array such that vortices formed, shed from and resonate with each of the oscillator. The interaction of the wake of each oscillator with oscillators in the downstream enhances the oscillation and the periodic force of the downstream oscillators. The natural frequency of each energy harvester is designed to match the vortex shedding frequency to create resonance phenomena. Furthermore, the energy harvesters are arranged into an array to enhance VIV phenomenon by formation effect, thereby generating larger wind force and enhancing the power output of the energy harvesters.

Figure 5A:
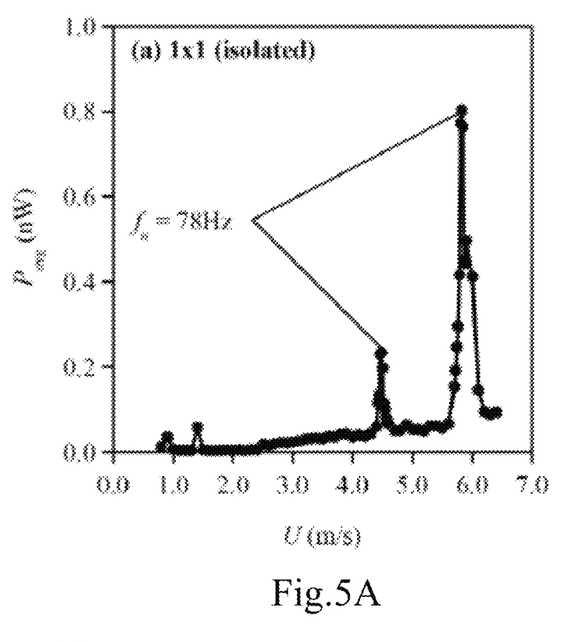
FIGS. 5A-5D are diagrams illustrating curves of the power output of a single oscillator in isolation and in 3×3 and 5×5 arrays obtained in wind tunnel experiments.
Figure 5B:
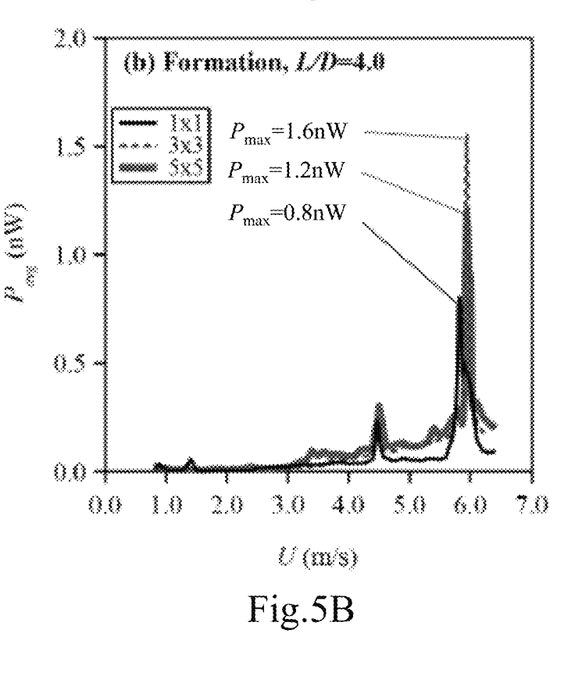
Figure 5C:
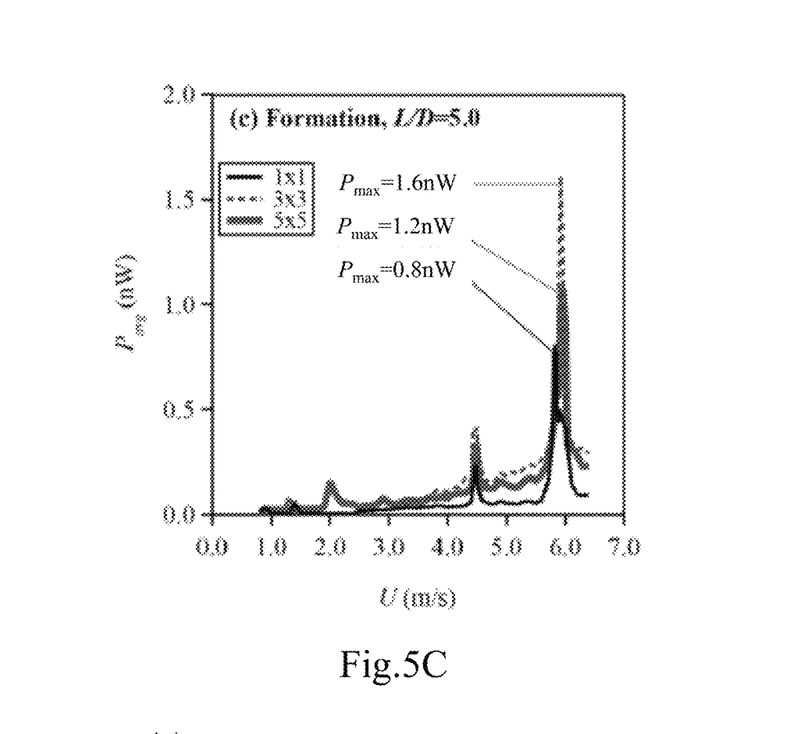

FIGS. 5A-5D are diagrams illustrating curves of the power output of a MEMS chip with single energy harvester in isolation and in 3×3 array and 5×5 array in wind tunnel experiments. In the first series of wind tunnel experiments, the energy harvester MEMS chip is placed at the center of the array. For each array, the average power $P_{avg}$ is measured over a range of wind tunnel speed, U, from 0.8 m/s to 6.4 m/s. The results, as shown in FIGS. 5A-5C, indicate that formation effect can significantly augment the trend of $P_{avg}$ against U. The higher the wind tunnel speed U, the higher the average power $P_{avg}$. The maximum value $P_{max}$ of $P_{avg}$ attainable within the experimental velocity range is significantly affected by formation effects. Notably, the energy harvester in array yields considerable higher $P_{max}$ than the same energy harvester in isolation. In particular, for the 3×3 array, the formation effect can double the $P_{max}$. It is observed that the energy harvester in the center of the 3×3 array yields higher $P_{max}$ compared to the same energy harvester in the center of the 5×5 array. Also, note that the L/D=4.0 and 5.0 formations have almost identical effects on the power output (where L is the centre-to-centre distance between upstream and downstream cylindrical oscillators and D is the cylinder diameter). As a result, when the distance between oscillators is larger, individual energy harvester in the array does not necessarily produce greater performance. Form the present experimental results, the energy harvesters in 3×3 array yields higher power output than the energy harvesters in 5×5 array. All in all, the power output generated by the individual energy harvester in the array is higher than the power output generated by a single energy harvester.

Figure 5D:
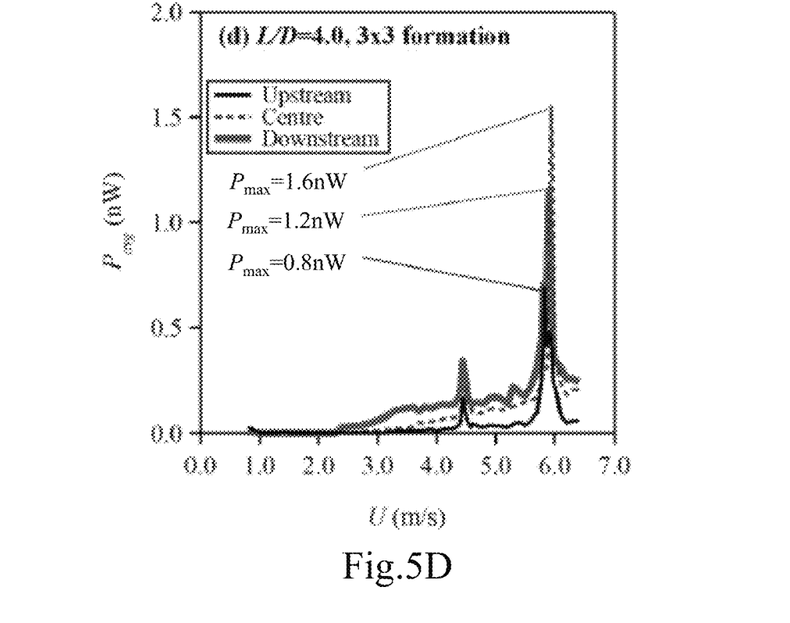

The second series of wind tunnel experiments is then conducted to find out whether the location of the energy harvester in a formation affects the power output. In the wind tunnel experiments, the arrangement of the dummy cylinders is changed so that the energy harvester becomes the upstream vortex generator (i.e. in the first row of the array) and the downstream vortex generator (i.e. in the third row of the array) in the 3×3 array with L/D=4.0. The results, as shown in FIG. 5D, indicates that, the energy harvester placed in the first row (most upstream position) of the array yields almost identical $P_{max}$ as the energy harvester in isolation (see FIG. 5A). $P_{max}$ augmentation is highest if the energy harvester is in the second row (middle row) of the array. Conversely, the energy harvester placed in the third row (most downstream position) encounters a smaller increase in $P_{max}$. In conclusion, the energy harvester placed in the center of the 3×3 array can produce the highest performance.

It should be noted that FIGS. 5A-5D are not necessarily the best experimental results. They are only used to illustrate the overall oscillation enhancement effect of the oscillator array, but not intended to limit the present invention. In addition, the oscillators array of the present invention is not limited to 3×3 or 5×5 formations with L/D=4.0 and 5.0. The size of the array is adaptable according to requirements.

According to the embodiments provided above, the vortex-induced vibration wind energy harvesting device has the following advantages:

a. It is structurally simple. Compared to rotational wind turbines, VIV mechanisms tend to have very simple structures which can be easily miniaturized without suffering high frictional losses at very small scales.

b. It is effective in energy harvesting at low wind speed because of the resonant and formation effects. The rotational wind turbines require high wind speed to overcome the friction to rotate the blades. Furthermore, rotational wind turbines cannot be arranged densely as the oscillators array of the present invention. Thus, the rotational wind turbines cannot enhance the power output of each other as the present invention.

c. The array in close formation can enhance the oscillation energy of oscillators, thereby generating higher power output.

The embodiments described above are only to exemplify the present invention but not to limit the scope of the present invention. Therefore, any equivalent modification or variation according to the shapes, structures, features, or essence disclosed by the present invention is to be also included within the scope of the present invention.

What is claimed is:

1. A vortex-induced vibration wind energy harvesting device comprising:

a plurality of oscillators arranged into an array, wherein when one of the plurality of oscillators generate and resonate with the periodic shedding vortices due to an incoming airflow, the oscillation of at least one of the plurality of oscillators in downstream wake is enhanced, thereby enhancing overall oscillation phenomena of the array; and     a plurality of piezoelectric microelectromechanical systems (MEMS), respectively connected to the plurality of oscillators, generating and outputting voltage and current due to oscillation of the plurality of oscillators.

2. The vortex-induced vibration wind energy harvesting device according to claim 1, wherein the plurality of oscillators are made out of hollow cylinders.

3. The vortex-induced vibration wind energy harvesting device according to claim 1, wherein each of the plurality of piezoelectric microelectromechanical systems include:

a microelectromechanical system chip;

a piezoelectric cantilever arranged on the microelectromechanical system chip;

a pad oxide layer arranged on the piezoelectric cantilever for insulation, wherein the pad oxide layer is designed with a first opening and a second opening, and one of the plurality of oscillators is mounted on a portion of the pad oxide layer;

a piezoelectric layer arranged on the piezoelectric cantilever, wherein a portion of the piezoelectric layer is located in the first opening, when the oscillators oscillates, the piezoelectric layer is deformed by bending force, thereby generating voltage and current; and two output terminals used as a positive terminal and a negative terminal respectively, wherein one of the two output terminals is arranged on the piezoelectric cantilever and arranged in the second opening, the other output terminal is arranged in the first opening, covers and connects to the piezoelectric layer, and the two output terminals are configured to output the voltage and current generated by the piezoelectric layer.

4. The vortex-induced vibration wind energy harvesting device according to claim 3, wherein an oxide layer is arranged between the microelectromechanical system chip and the piezoelectric cantilever.

5. The vortex-induced vibration wind energy harvesting device according to claim 3, wherein a cantilevered portion of the piezoelectric cantilever is suspended, the microelectromechanical system chip is not arranged under the cantilevered portion, and one of the plurality of oscillators and the piezoelectric layer are arranged on the cantilevered portion.

6. The vortex-induced vibration wind energy harvesting device according to claim 3, wherein the piezoelectric layer is made of aluminum nitride.

7. The vortex-induced vibration wind energy harvesting device according to claim 1, wherein the plurality of oscillators are spaced at uniform intervals.

\* \* \* \* \*